United States Patent [19]

Schlig

[11] Patent Number: 4,489,309

[45] Date of Patent: * Dec. 18, 1984

[54] PIPELINED CHARGE COUPLED TO ANALOG TO DIGITAL CONVERTER

[75] Inventor: Eugene S. Schlig, Somers, N.Y.

[73] Assignee: IBM Corporation, Armonk, N.Y.

[*] Notice: The portion of the term of this patent subsequent to Feb. 22, 2000 has been disclaimed.

[21] Appl. No.: 279,118

[22] Filed: Jun. 30, 1981

[51] Int. Cl.³ ............................................. H03K 13/08
[52] U.S. Cl. ......................... 340/347 AD; 340/347 M; 357/24
[58] Field of Search .................... 340/347 M, 347 AD; 357/24

[56]  References Cited
U.S. PATENT DOCUMENTS

| 3,119,105 | 1/1964 | Jepperson | 340/347 AD |
| 3,315,251 | 4/1967 | Kaneko | 340/347 AD |
| 3,930,255 | 12/1975 | Means | 340/347 AD |
| 4,107,670 | 8/1978 | Hornak | 340/347 DA |
| 4,336,525 | 6/1982 | Chapple | 340/347 AD |
| 4,375,059 | 2/1983 | Schlig | 340/347 AD |

Primary Examiner—T. J. Sloyan
Attorney, Agent, or Firm—Pollock, Vande Sande & Priddy

[57] ABSTRACT

A pipelined charge coupled analog to digital converter which provides a plurality of serially arranged pipelined stages that are connected to pass signal and reference charge packets from stage to stage in a serial progression. The pipelined analog to digital converter includes one stage for each bit desired in the output bit stream, and thus, an analog to digital converter providing an n bit digital word corresponding to the input analog signal charge, includes n stages. While the time necessary to perform the analog to digital conversion is the sum of operating times of all the stages, because the converter is pipelined, each successive n bit digital word representing a different successive charge packet is produced succeeding a preceding digital word representing a preceding signal charge packet, by a delay equal to the processing time of only a single stage. Thus, a charge coupled A/D system is provided including a plurality of pipelined stages for performing successive approximations on a reference charge $Q_r$ and an input analog signal charge $Q_s$ wherein said pipelined stages include charge processing means each coupled only to directly adjacent stages for performing an inequality function to provide a bit string $b_1$ through $b_n$ representing a digital representation of said input analog signal charge $Q_s$.

3 Claims, 18 Drawing Figures

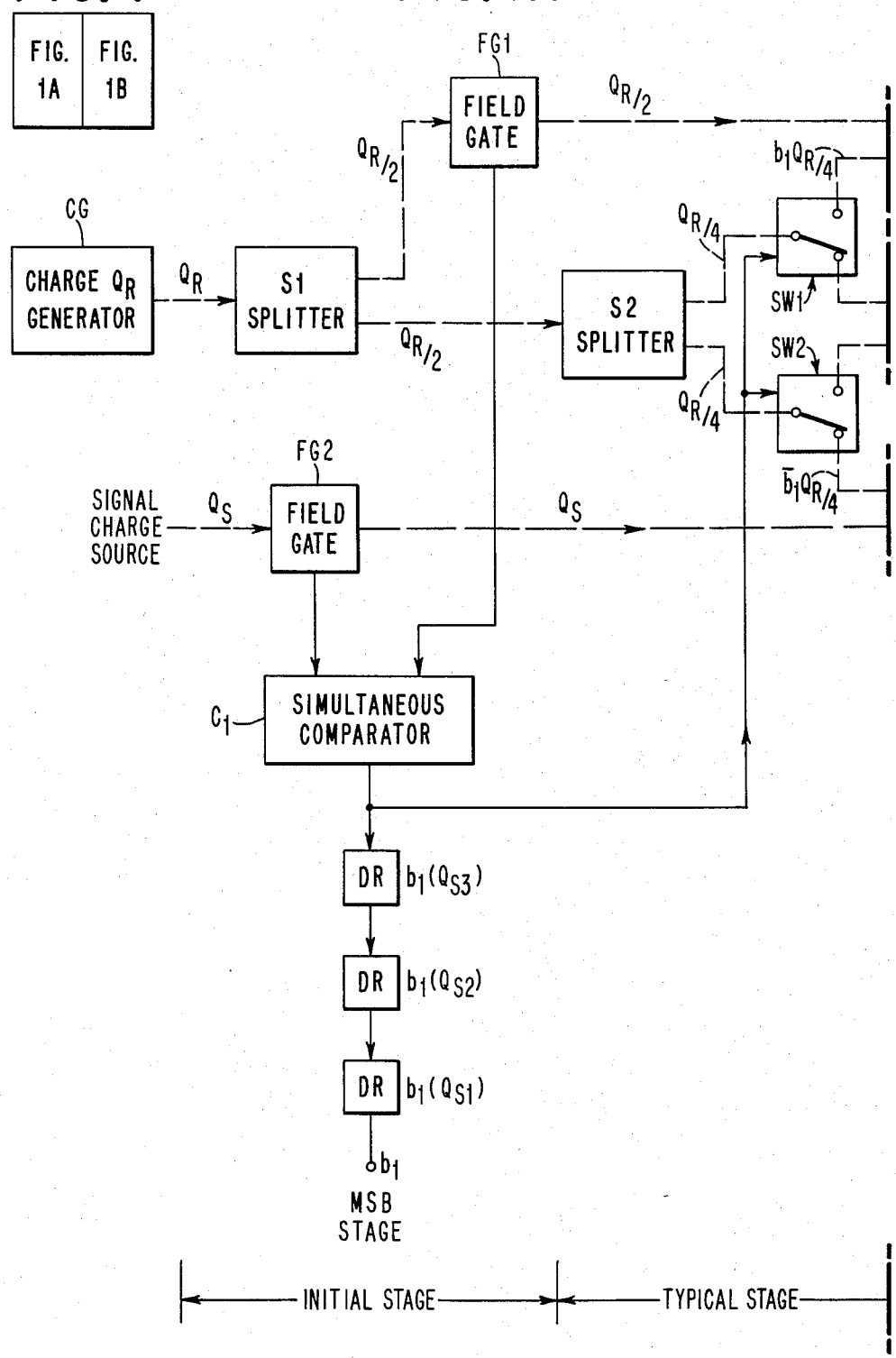

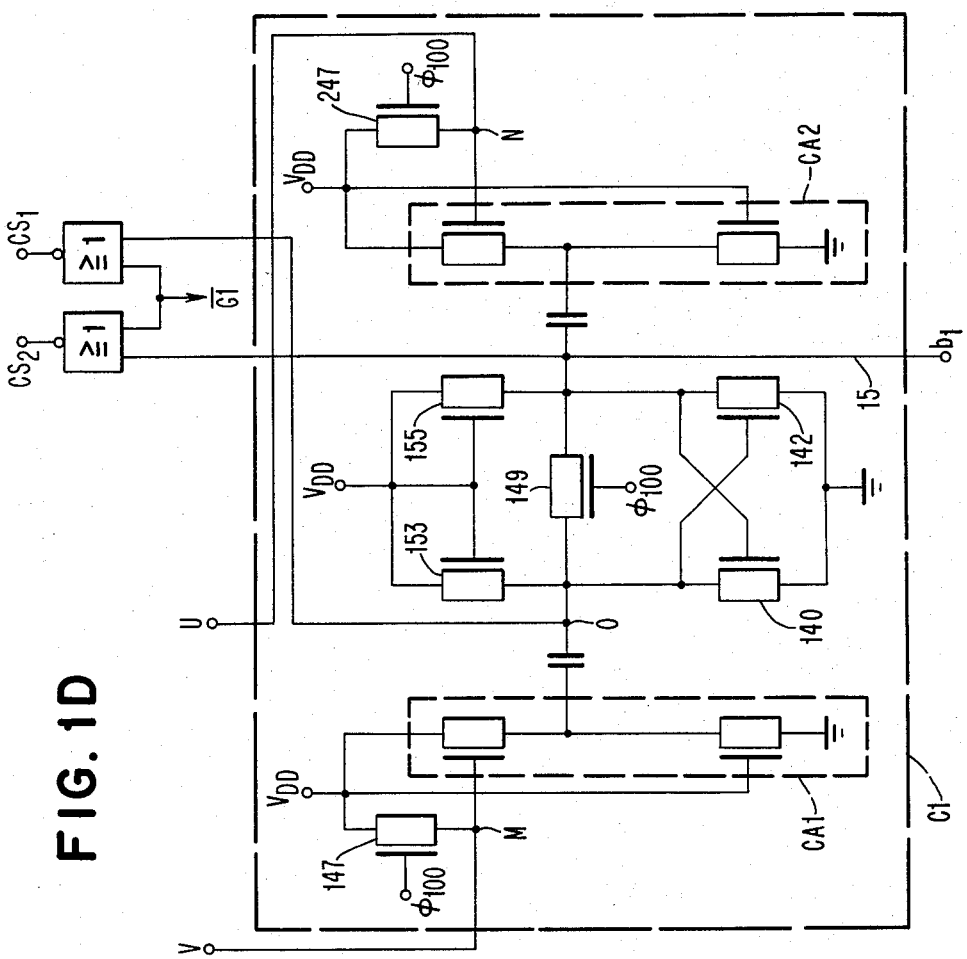

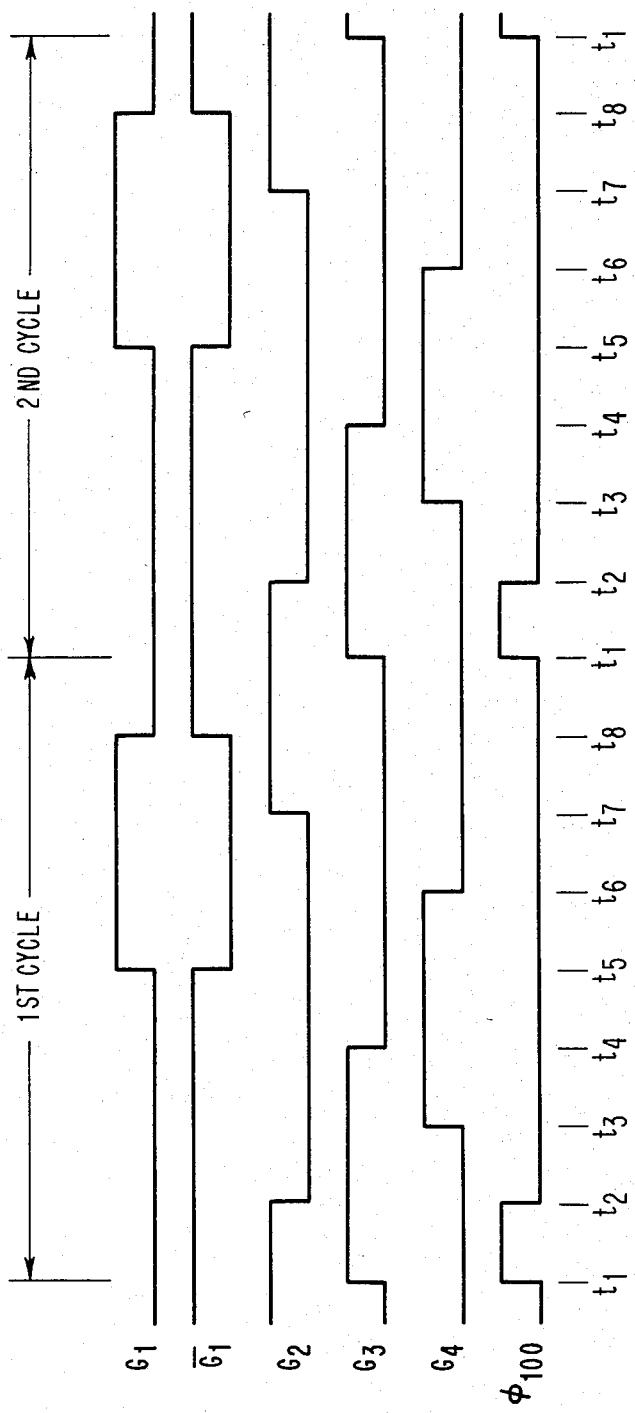

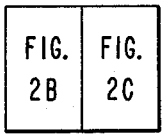
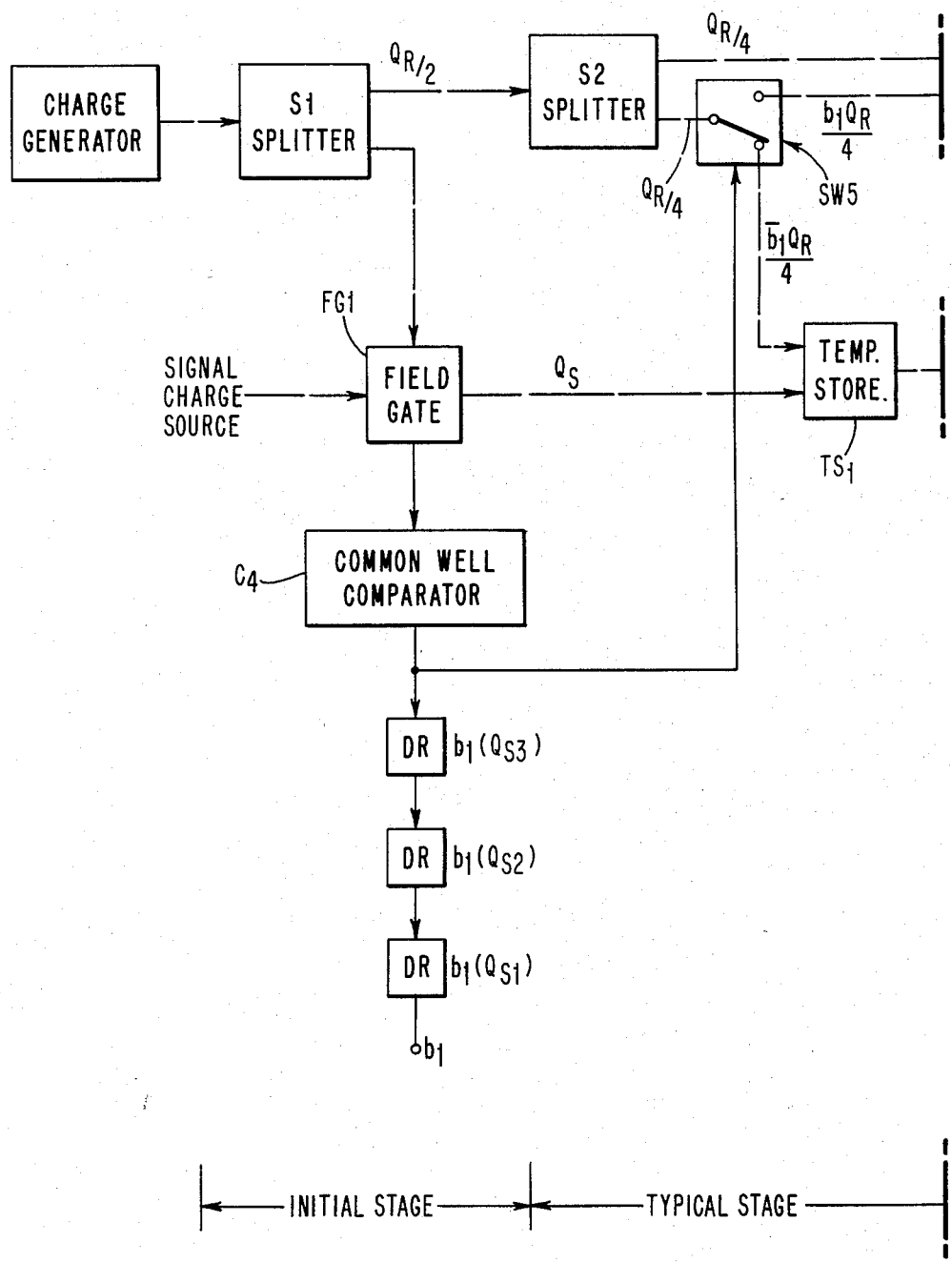
FIG. 2A
FIG. 2B

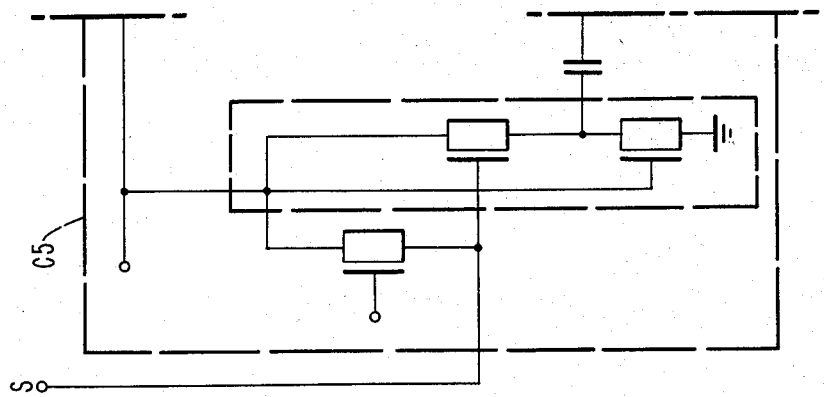
FIG. 2H
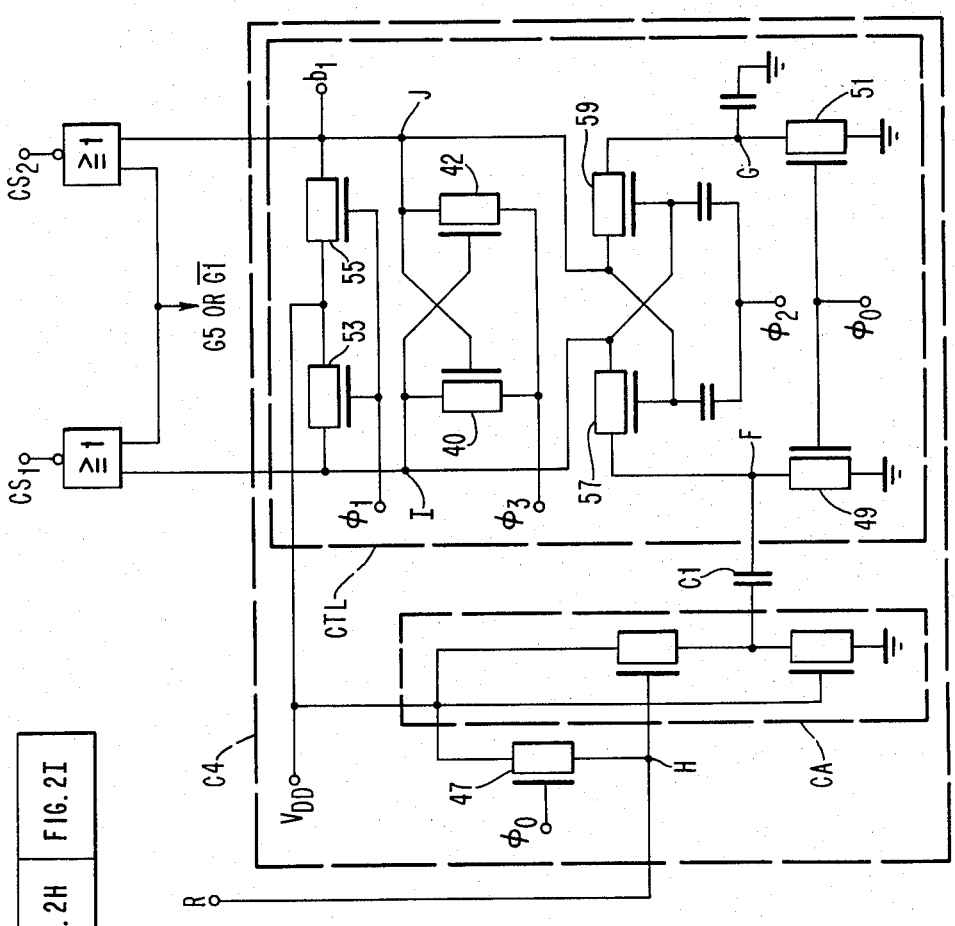
| FIG.2G | FIG. 2H |
|---|---|
| | FIG. 2I |

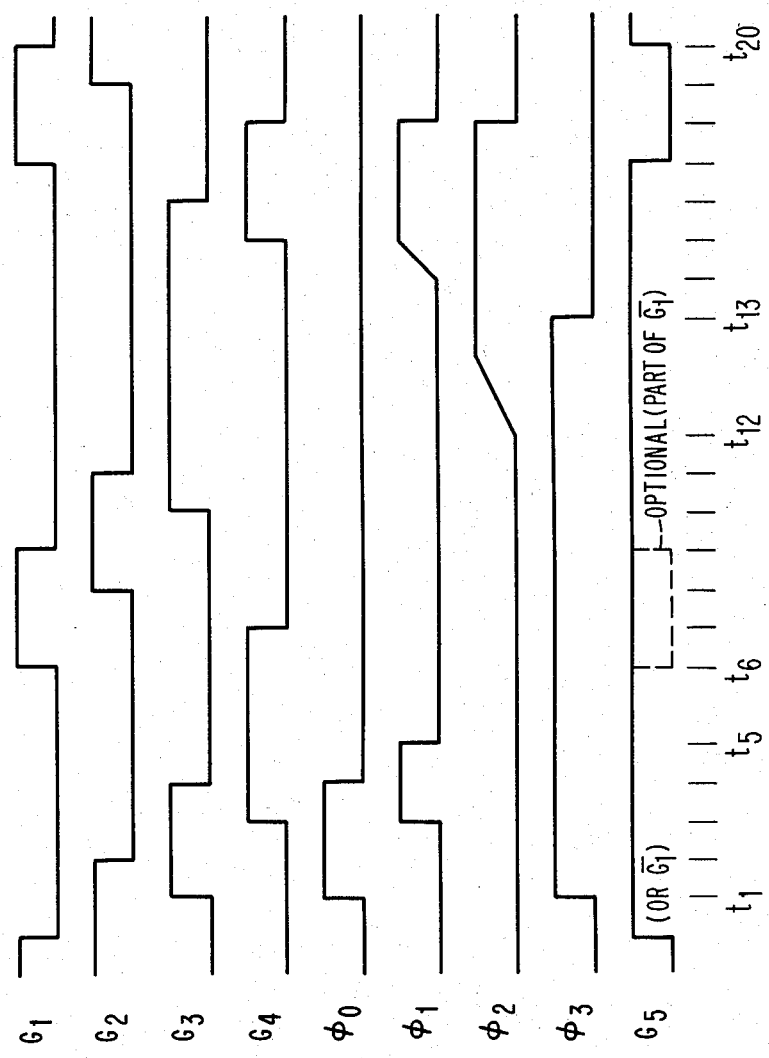

PIPELINED CHARGE COUPLED TO ANALOG TO DIGITAL CONVERTER

TECHNICAL FIELD

The invention relates to an analog to digital converter which operates on charge quanta. Preferred embodiments are implemented as charge coupled devices (CCD), and its features include pipelined operation and limited requirements for chip real estate.

BACKGROUND ART

The basic objective in providing an analog to digital converter is to perform the function accurately, rapidly and with minimal expense; one of the important parameters determining the expense is required chip area. Analog to digital converters and analog to digital converters which are capable of operating on charge quanta have been examined in the prior art, see for example, my copending application entitled "Fast Charge Transfer Analog to Digital Converter", Ser. No. 143,704 (Docket Y0979-030) filed Apr. 25, 1980, now U.S. Pat. No. 4,375,059 issued Feb. 22, 1983, as well as the prior art cited therein.

One particular failing of prior art pipelined charge coupled analog to digital converters (at least those including three or more stages) is the requirement that at least one, and perhaps several low order stages be connected to more than one higher order stage. This connection requires excessive real estate and may indeed complicate the chip layout. Concomitantly, one or more low order stages require a substantial amount of logic to generate a reference charge or voltage based on the state of one or more higher order stages. One example of such prior art pipelined charge coupled analog to digital converter is found in Merrill et al Ser. No. 47,557 filed June 11, 1979 and assigned to the assignee of this application.

Another pipelined charge coupled analog to digital converter is described in an article by Tompsett entitled "Video Signal Generation" included in the book *Electronic Imaging* edited by McLean et al (Academic Press, 1979) at pages 92-94. The Tompsett analog to digital converter uses charge subtraction. Charge subtraction in charge coupled devices, is a time consuming process when compared with charge addition. In addition, charge subtraction is subject to inaccuracies.

Accordingly, it is an object of the invention to provide a relatively simple and compact analog to digital converter which operates in a pipelined mode to rapidly digitize a successive stream of analog signals. It is a more particular object of the invention to provide a relatively simple and compact charge coupled analog to digital converter which operates in the pipelined mode to rapidly digitize a sequential stream of analog charge packets by a process of successive approximation.

Another object of the invention is to provide for a charge coupled analog to digital converter in which not only is the signal charge propagated down the pipeline, but the reference charge is propagated as well and accordingly, only a single reference charge generator is needed. It is another object of the present invention to provide for a pipelined charge coupled analog to digital converter including a plurality of stages, in which processing requires, at any one stage, only information generated from the next higher order stage, and accordingly, the real estate and logic dedicated to interconnecting various stages is minimized.

DISCLOSURE OF THE INVENTION

In order to achieve the objects of the invention, a pipelined charge coupled analog to digital converter provides a plurality of serially arranged pipelined stages that are connected to pass signal and reference charge packets from stage to stage in a serial progression. The pipelined analog to digital converter includes one stage of each bit desired in the output bit stream, and thus, an analog to digital converter providing an n bit digital word corresponding to the input analog signal charge, includes n stages. While the time necessary to perform the analog to digital conversion is the sum of operating times of all the stages, because the converter is pipelined, each successive n bit digital word representing a different successive charge packet is produced succeeding a preceding digital work representing a preceding signal charge packet, by a delay equal to the processing time of only a single stage. Thus in accordance with one aspect, the invention provides a charge coupled A/D system including a plurality of pipelined stages for performing successive approximations on a reference charge $Q_r$ and an input analog signal charge $Q_s$ wherein:

said pipelined stages include charge processing means each coupled only to directly adjacent stages for performing an inequality function to provide a bit string $b_l$ through $b_n$ representing a digital representation of said input analog signal charge $Q_s$.

In accordance with the invention each stage includes a comparator subjected to two input signals, a first either the input analog signal charge $Q_s$ or a processed version thereof and the second, either the reference analog charge $Q_r$ or a processed version thereof. Depending on which of the two input signals is greater, the comparator produces one of two possible output signals representing a particular bit of the resulting digital output. Two embodiments of the invention disclosed herein employ two different types of comparators, either a simultaneous comparator, in which the comparator inputs are presented simultaneously at two input terminals or a sequential comparator in which the comparator inputs are presented time sequentially at a common input terminal.

More particularly, in accordance with a first embodiment of the invention the first, input, or most significant bit stage of the converter includes a charge splitter ($S_l$) with single input and two outputs, for splitting the reference charge $Q_r$ to provide two output charge quanta, each equal to $Q_r/2$; the first of these outputs, the comparator reference charge packet, is provided to a first field gate, and a second of these outputs is provided to a second charge splitter (in a subsequent stage), whose two outputs therefore, each correspond to $Q_r/4$. The first stage includes a second field gate to which the analog signal charge $Q_s$ is provided. The field gates at the first stage provide the (simultaneous) inputs to a comparator (included therein) and accordingly, in this first stage the signal charge $Q_s$ is compared with the comparator reference charge packet, $Q_r/2$. If the signal charge is larger than $Q_r/2$ then the most significant bit ($b_1$) is a 1 and conversely if $Q_s$ is less thant $Q_r/2$, $b_1$ is a zero.

The second and each of the following stages (except for the last) is identical (hereinafter a typical stage). The first typical stage has a third field gate, to which the output of the first field gate is connected and a fourth field gate to which the output of the second field gate is connected; the field gates again providing the inputs to the comparator. The stage includes the second charge splitter ($S_2$). Each of this stage's field gates include an additional input, the third field gate has a second input which may carry a modification charge packet from the second splitter (that is $Q_r/4$) in the event that the most significant bit ($b_1$) is a one. Likewise, the fourth field gate has a second input which may be subjected to a modification charge packet ($Q_r/4$), if the most significant bit ($b_1$) is a zero. Accordingly, regardless of the state of the most significant bit ($b_1$) one of the two just referred to charge packets $Q_r/4$ will not be required for either of the field gates. This unused charge packet is coupled to a merging site where it is made available to a splitter in a subsequent stage. The second stage comparator thus compares the charge packets in the third and fourth field gates and produces the next most significant bit ($b_2$) depending on whether the signal input is larger or smaller than the reference input. Depending on the condition of the most significant bit ($b_1$) the reference charge packet will be either $Q_r/2$ or $3Q_r/4$ and the second stage signal packet will be either $Q_s$ or $Q_s+Q_r/4$. In accordance with this embodiment of the invention switching the output of the second splitter is accomplished via a switch or charge diverter which is controlled by the output of the first stage comparator to direct the two charge packets produced by the second splitter to either the third field gate and the merge site, or conversely to the merge site and the fourth field gate.

The progression established in the first typical stage is continued in each subsequent typical stage. Thus, in contrast to some prior art converters, each stage is coupled only to directly adjacent stages.

If desired, each stage may include stages of a deskewing register so that bits associated with the same input signal charge quanta are output simultaneously.

In accordance with another embodiment of the invention each of the comparators is subjected to sequential inputs. To this end, each stage includes only a single field gate, since both charge packets to be input to the comparator are funneled through the single field gate. On the other hand, a second and each subsequent stage includes a temporary storage site for temporarily storing either the signal charge packet or its processed representative or the reference charge packet or its processed representative. Each stage includes a charge splitter. The splitter of the first stage produces a pair of output charge packets $Q_r/2$, and the splitter of the second stage produces a pair of charge packets $Q_r/4$; the first of these $Q_r/4$ packets is provided to the splitter of the next adjacent stage and the other (modification packet) is provided to a diverter (or switch) controlled in accordance with the first stage's comparator output. This modification charge packet can be coupled through the switch either to the temporary storage site or the field gate, where it is summed with either the comparator reference or signal charge packet.

While I have described the charge summation as occurring in the field gates, it should be understood that the summation can alternatively be effected at a site preceding the field gate.

BRIEF DESCRIPTION OF THE DRAWINGS

In the drawings, like reference characters identify identical apparatus and;

FIGS. 1 and 1A–1G relate to a first embodiment of the invention;

FIGS. 1A and 1B (when associated as shown in FIG. 1) illustrating an overall block diagram of the analog to digital converter;

FIG. 1C illustrates a schematic of the various polysilicon CCD gate electrodes which could be used in implementing the first embodiment of the invention;

FIGS. 1D and 1E (when associated as shown in FIG. 1G) comprising a schematic of a suitable comparator (and NOR gates) for use in the first embodiment of the invention;

FIG. 1F comprises a timing diagram showing the relative timing of various signals used in a first embodiment of the invention;

FIGS. 2A–2J relate to a second embodiment of the invention; FIGS. 2B and 2C comprising an overall block diagram of the analog to digital converter in accordance with the second embodiment (when associated as shown in FIG. 2A);

FIGS. 2E and 2F comprising a schematic of CCD gate electrode layout which could be used in implementing a second embodiment of the invention (when associated as shown in FIG. 2D);

FIGS. 2H and 2I comprising a schematic of a suitable comparator (and NOR gates) for the second embodiment of the invention (when associated as shown in FIG. 2G); and FIG. 2J comprising a timing diagram for several appropriate signals used in a second embodiment of the invention.

BEST MODE FOR CARRYING OUT THE INVENTION

Before describing the detail the two preferred embodiments of the invention, the algorithm which both embodiments implement will be described. In this connection, and in the remaining parts of this application $Q_s$ refers to an analog signal charge packet which is input to the analog to digital converter, $Q_r$ refers to a reference charge packet and is at the same time equal to the maximum allowable charge $Q_s$. The analog to digital converter determines a N bit binary word of value W such that $Q_r$ times the ratio of $W/2^N = Q_s$ to some appropriate approximation. W is represented as a bit string, $b_1, b_2 \ldots b_N$, where $b_1$ is the most significant bit (MSB) and $b_N$ is the least significant bit. The analog to digital converter includes a number of stages equal to N and thus has one stage for each bit; each stage includes a comparator for comparing a charge packet which is either the signal charge packet or one derived therefrom with either a reference charge packet or one derived therefrom. For a typical stage, n, the output bit $b_n$ is determined as $$b_n \leftarrow Q_s + \sum_{x=1}^{n-1} \overline{b_x} \frac{Q_r}{2^{x+1}} \gtreqless \frac{Q_r}{2} + \sum_{x=1}^{n-1} b_x \frac{Q_r}{2^{x-1}}$$

where $\overline{b_x}$ is the inverse of $b_x$. Each stage determines the inequality and produces an output $b_n$ which is 1 if the inequality is satisfied and 0 if it is not. In order to present the proper input quantities to the comparator at each stage, two charge transfer paths are supported. In a first embodiment the two paths are space separated parallel paths. In the second embodiment the two paths are time multiplexed on a single physical path. In a reference charge transfer path (beginning at the charge generator CG) $Q_r$ or $Q_r$ modified, as required by higher order stages, is propagated. A parallel signal charge transfer path propagates (beginning at the signal input) $Q_s$ or $Q_s$ modified, as required by higher order stages.

Of the two embodiments of the invention which will be described in detail, the first (FIGS. 1 and 1A–1G) is optimized for speed and incorporates a simultaneous comparator. The other (FIGS. 2A–2J) is optimized for high precision using sequential comparators or a "common well" comparator to which the inputs are presented sequentially. Each of the comparators is in and of itself known in the prior art. Suitable comparators are described in my copending application, however, other comparators could also be used within the scope of the invention.

In some FIGS. (1A and 2B for example) two types of connections are represented, a solid line represents an electrical connection, and a dashed line represents a charge transfer path.

Of course the former can be implemented as merely a conductive stripe whereas the latter is implemented as a series of charge sites whose potential is controlled by sequential clocking signals.

Figure 1B:
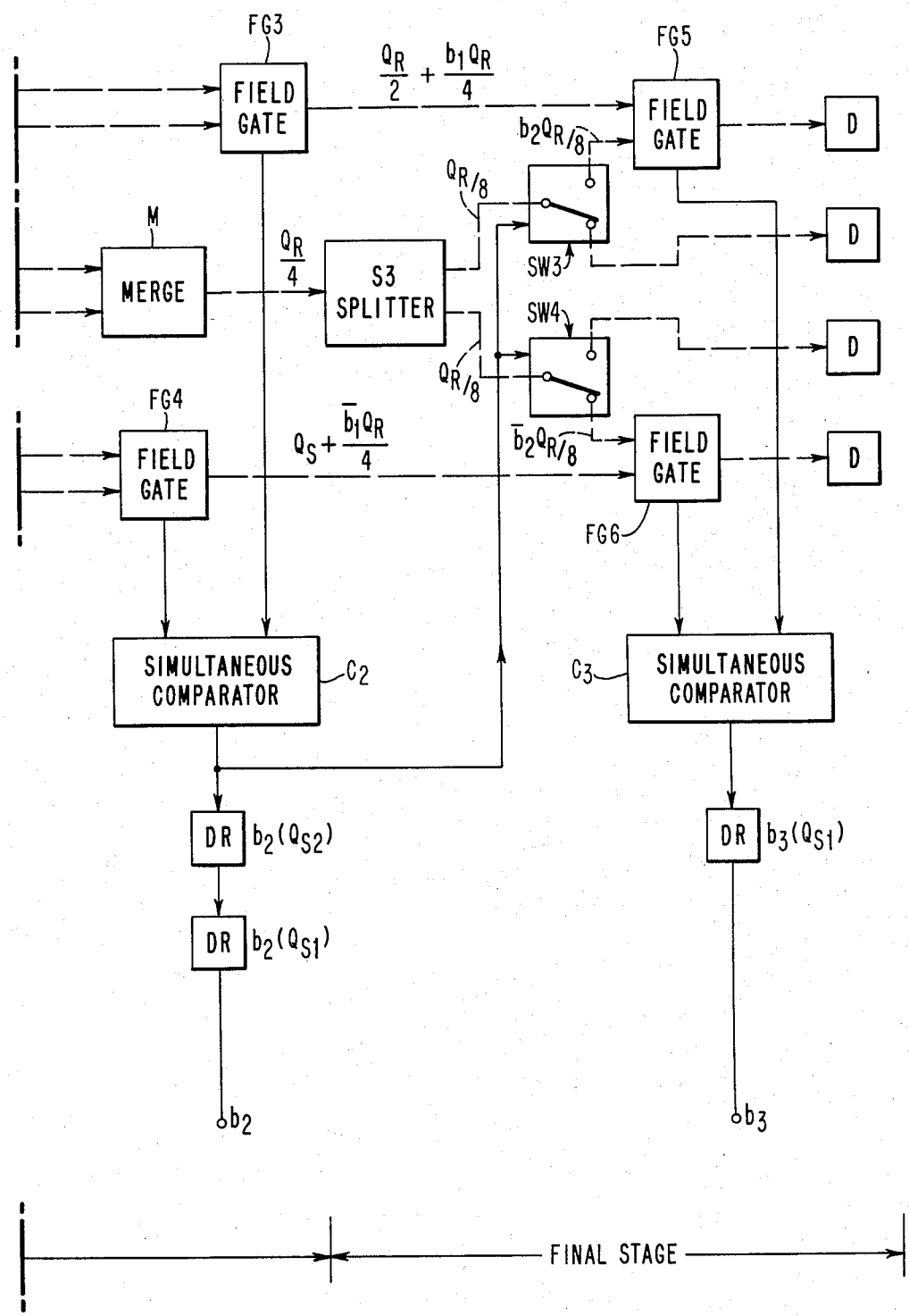
Figure 1C:
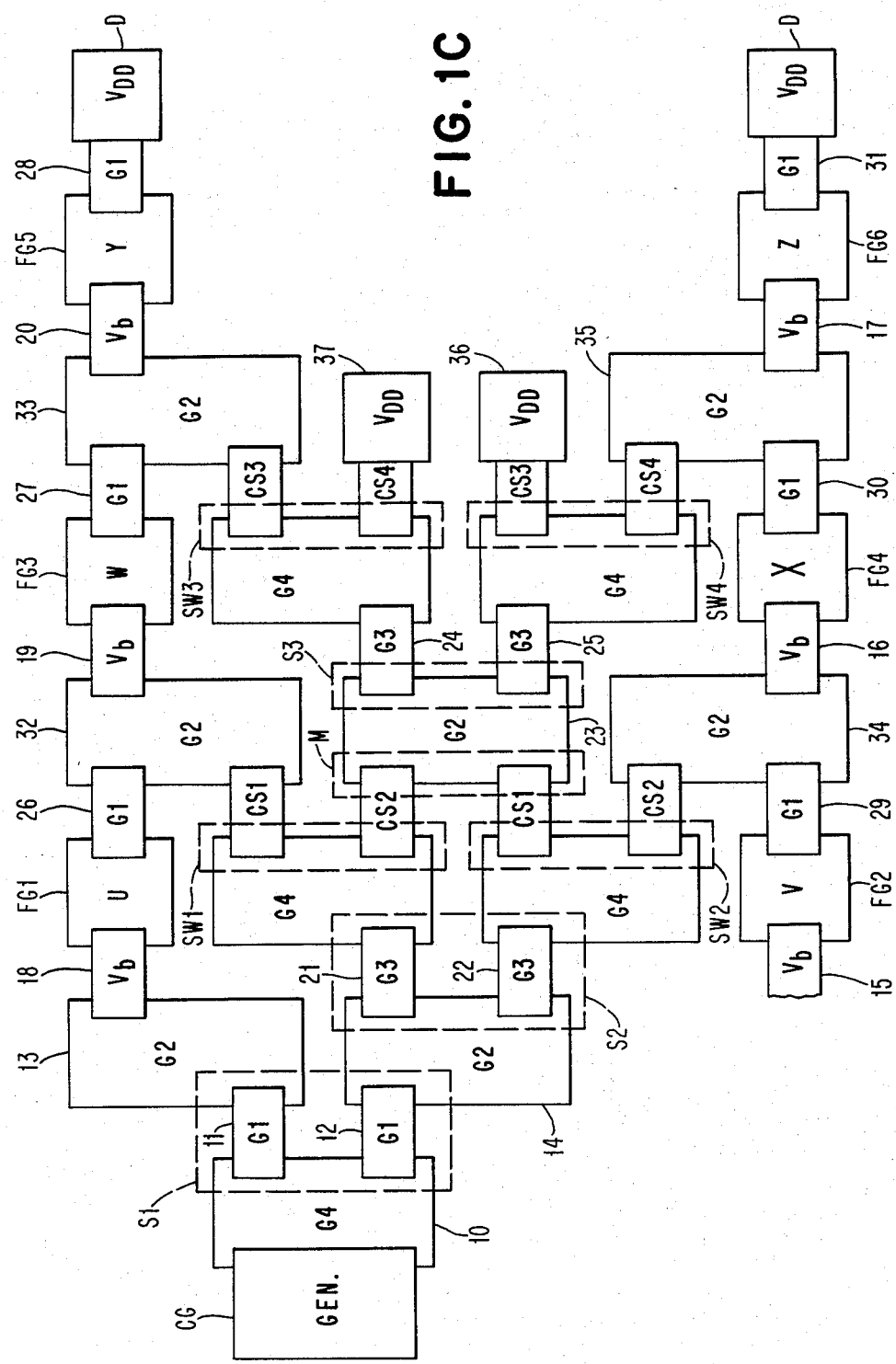

Referring now to FIGS. 1A and 1B, a block diagram of a first embodiment of the invention is illustrated. Although FIGS. 1A–1G illustrate only a three stage analog to digital converter, those skilled in the art are aware that the number of stages can be changed. The analog to digital converter is made up of an initial stage or most significant bit generating stage, and a number of typical stages, each of the latter are identical (except for an optionally used deskewing register); FIGS. 1A–1B represent the components in each of the stages. The components of the analog to digital converter include a charge generator CG for generating a reference charge packet ($Q_r$) of magnitude equal to the greatest allowable magnitude for the signal charge packet $Q_s$. The particular charge generator CG employed can be any of those known to those skilled in the art such as that for example, shown in the book by Sequin et al, *Charge Transfer Devices* at FIGS. 3.13 on page 51 (Academic Press 1975). The comparators C1–C3 are shown in more detail in FIGS. 1D–1E, the field gates (FG), splitters (S) and merging sites (M) are implemented as configurations of CCD electrodes a schematic of which is provided in FIG. 1C. Likewise, the switches $SW_1$ et seq are also implemented as CCD electrodes which are illustrated in FIG. 1C.

The field gates (FG) are floating gate nondestructive charge sensing sites which output a voltage (on the solid conductive output) proportional to the change in charge in the potential well beneath them. Since the field gate is nondestructive, the charge producing the change can be moved out of the field gate, as is represented in FIGS. 1A and 1B, by the dotted charge transfer path between $FG_2$ and $FG_4$.

The analog to digital converter also includes charge splitters S which divide an input charge packet into two equal parts (exemplary splitters are described in more detail in the copending application).

Charge merging sites M are also included in the typical stage which combine charge packets from two input ports. Such merging sites M are also known to those skilled in the art.

The final or least significant bit stage includes a plurality of drains D each of which are diffused or implanted drains to remove signal and reference charge from the analog to digital converter. Drains are also known to those skilled in the art.

Both the typical stage and the least significant bit stage include charge diverters SW arranged to steer an input charge packet or packets into one of a pair of possible output paths according to the state of controlling signals. As is shown in FIG. 1A the control for charge diverters $SW_1$ and $SW_2$ is provided by the output of the most significant bit stage comparator $C_1$. These charge diverters are analogous to single pole double throw switches.

Finally, each of the stages may include stages of optional deskewing digital shift registers (DR), as shown, so that the binary word, representing one particular input packet, appears simultaneously at parallel digital output ports. As should be apparent from FIGS. 1A–1G increasing the number of bits in the digital word W produced by the analog to digital converter is obtained by increasing the number of typical stages. (The length of the deskewing register, if used, will differ in each of the added typical stages).

The pipelined analog to digital converter includes a signal charge path and a reference charge path. Each of these paths include a field gate for each stage. As is shown in FIGS. 1A–1B the reference charge path is the upper of the parallel charge paths and the signal charge path is the lower charge path. An intermediate charge transfer path is traversed by modification charge packets. In implementing the algorithm, the charge packet carried in the reference charge path may be modified from stage-to-stage and depends on the binary bits of the higher order stages. Likewise, the signal charge path carries a charge packet which may also be modified, again depending on the condition of bits of higher order stages. The controlling signals for the diverters of a stage originate from the comparator of a preceding stage, only.

In the first stage, the reference charge $Q_r$ is first split ($S_1$) and one of the charge packets, the comparator reference charge, $Q_r/2$ is applied to a potential well under $FG_1$. The input analog signal charge packet, $Q_s$ is applied to the potential well under field gate $FG_2$. The potential wells are created by charging up the field gate electrode under control of the comparator clock pulse. The same clock phase is used to critically balance the comparator $C_1$. Potentials corresponding to those of the potential wells are applied by $FG_1$ and $FG_2$ to the now critically balanced comparator $C_1$. The comparator then switches to one of its two stable states under the influence of these potentials. It will switch to one state ("1") if $Q_s$ is greater than or equal to $Q_r/2$, otherwise the comparator switches to its other stable state ("0"). Under control of suitable clock pulses the sequential outputs of the comparator $C_1$ propagate in the delay stages DR of the deskewing register (if provided). The other output from splitter $S_1$ is provided as an input to the next stage splitter $S_2$, and the two outputs of $S_2$ (each $Q_r/4$) are applied to a pair of diverters $SW_2$ and $SW_2$. The uppermost one of these diverters ($SW_1$) applies $Q_r/4$ to either $FG_3$ or M, and likewise the other diverter $SW_2$ applies the other packet $Q_r/4$ to either the merge site M or $FG_4$. Which of the charge packets $Q_r/4$ is steered where depends on the condition of the comparator $C_1$. Regardless of that condition, however, there will always be one packet $Q_r/4$ directed to the merging site M where it is coupled to the splitter $S_3$. Since the field gate $FG_3$ has $Q_r/2$ applied thereto, the resulting charge at $FG_3$ is $Q_r/2$ or that quantity summed with $Q_r/4$. Likewise the charge at $FG_4$ is either $Q_s$ or that quantity summed with $Q_r/4$. As mentioned, FIGS.

1A-1B show the summation occurring at the field gate but that it is not essential. The only requirement is that the summation occur at or prior to the field gate. Under appropriate clock control the potentials created at $FG_3$ and $FG_4$ are applied to comparator $C_2$ wherein the same operation occurs, that is its output is switched to one of two stable states depending on whether or not the potential at $FG_4$ is greater than or equal to the potential at $FG_3$. This provides another bit in the analog to digital conversion of the signal charge packet and also controls the condition of diverters $SW_3$ and $SW_4$.

Referring back to the algorithm, it should be apparent that field gates in the analog source transfer path ($FG_4$, $FG_6$, etc.) have built up therein $$Q_s + \sum_{x=1}^{n-1} \bar{b}_x \frac{Q_r}{2^{x+1}}$$

whereas the reference path has built up therein $$Q_r/2 + \sum_{x=1}^{n-1} b_x \frac{Q_r}{2^{x+1}}$$

and accordingly, each comparator can make the comparison and provide an output signal indicative of whether or not the inequality is satisfied. Furthermore, reference to FIGS. 1A-1B should make it apparent that the foregoing is achieved while at the same time ensuring that any typical stage or the final stage is only responsive to comparator condition of the immediately preceding stage (and this stage only).

In accordance with the pipelining principle, assume that a analog charge source supplies sequential analog signal charge packets $Q_{s1}$ through $Q_{s3}$. When $Q_{s1}$ is at $FG_2$, the following charge packets have not yet entered the A/D converter and the comparator produces a most significant bit ($b_1$) corresponding to the first signal charge packet. At a later time, when $Q_{s1}$ has moved to the second stage, then $Q_{s2}$ is in the first stage. Accordingly, at that time, comparator $C_2$ develops $b_2(Q_{s1})$ and comparator $C_1$ develops a most significant bit ($b_1$) for $Q_{s2}$. At a still later time, when $Q_{s1}$ has moved on to the final stage, then $Q_{s2}$ is in the second stage, and $Q_{s3}$ is in the first stage. Accordingly, at that time, comparator $C_1$ develops $b_1(Q_{s3})$, comparator $C_2$ develops $b_2(Q_{s2})$ and comparator $C_3$ develops $b_3(Q_{s1})$. With the deskewing registers as shown in FIGS. 1A-1B, therefore, for a three stage A/D converter, bits $b_1$-$b_3$ ($Q_{s1}$) are simultaneously available. After a delay equal to the processing time for a single stage, the deskewing register makes available bits $b_1$ through $b_3$ ($Q_{s2}$); thus, within a time equal to the delay of a single processing stage, the pipelined A/D converter provides a different output.

Important to the functioning in the A/D converter is the combination of the splitter $S_2$, the charge diverters $SW_1$ and $SW_2$ and the merge site M. This particular sub-system accepts a charge packet, splits it ($S_2$) and then supplies one of the split charge packets to one of the two field gates $FG_3$ or $FG_4$, and still has a remaining charge packet which may be coupled through the merge site M to subsequent processing stages. This allows the algorithm to be implemented and does not require crossing of charge transfer paths, which would have created a particularly significant problem in implementation.

Figure 1E:
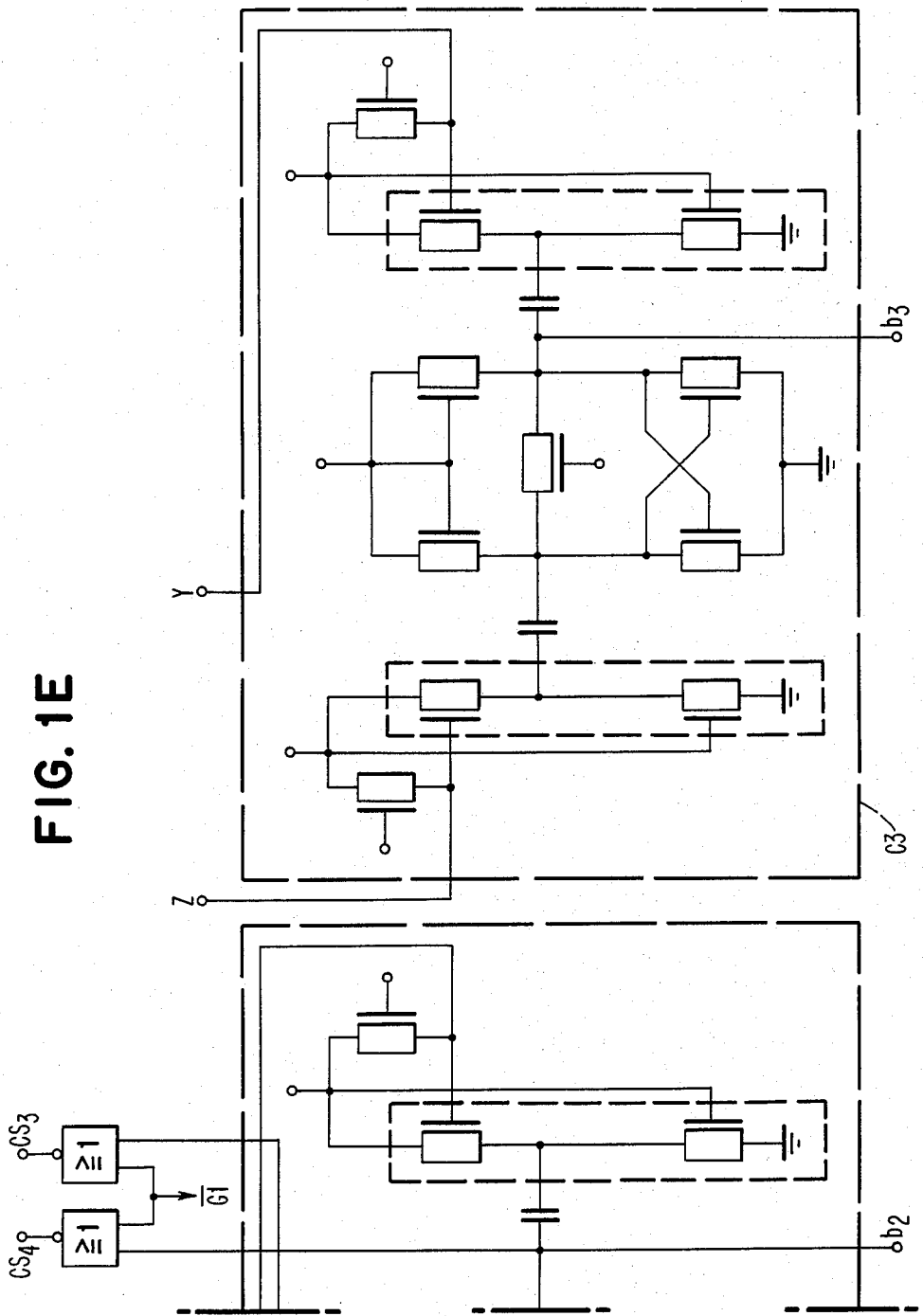

FIGS. 1C-1E illustrate a schematic of the polysilicon CCD gate electrodes to implement the necessary charge transfer paths and connections to the required comparators, and a schematic of an appropriate comparator.

FIG. 1C is a plan view of an electrode layout for implementing the charge transfer paths for the A/D converter of FIGS. 1A-1B. In FIG. 1C, the various electrodes are represented as polysilicon CCD gate electrodes comprising two overlapping layers insulated from each other and from a silicon substrate. The CCD channel lies in the substrate beneath the electrodes, and the area between electrodes comprises a channel stop region. The labels within the electrodes refer to gating signals, switch control signals, voltage levels ($V_b$,$V_{dd}$) or comparator input terminals U-Z. The reference characters attached to the electrodes, or to the dashed lines surrounding several electrodes refer to the corresponding block in FIGS. 1A-1B.

As is well known to those skilled in the art charge packets are advanced from one electrode to an adjacent electrode by raising the potential on the adjacent electrode and lowering the potential on the one electrode. Referring to FIGS. 1C and 1F, a charge packet can be advanced from a $G_3$ electrode to a $G_4$ electrode by raising the $G_4$ electrode potential ($t_3$) and subsequently lowering the $G_3$ potential ($t_4$). If we assume a field gate is reached (from a $G_4$ electrode) via electrodes $G_1$ and $G_2$ to an electrode at a fixed intermediate potential, then a sequence of $G_1$ and $G_2$ potential changes as shown in FIG. 1F will achieve this goal. At $t_5$, $G_1$ is raised and while $G_1$ is up, $G_4$ falls ($t_6$). Thereafter (with $G_1$ up) $G_2$ is raised ($t_7$). The fall of $G_1$ ($t_8$) and $G_2$ ($t_2$ of the next cycle) causes a charge packet to be transferred over the potential barrier induced by the intermediate fixed potential $V_b$ and into the well under the field gate ($FG_1$, for instance).

The splitter, for example, $S_1$ is implemented as is shown in FIG. 1C via a $G_4$ electrode 10 and two $G_1$ electrodes 11 and 12. The output of splitter $S_1$ is coupled to $FG_1$ via a $G_2$ electrode 13 and the $V_b$ electrode. In a similar fashion, the other output of the splitter $S_1$ is coupled to the splitter $S_2$ via the intervening $G_2$ electrode 14. In this fashion the correspondence between the block diagram in FIGS. 1A-1B and the electrode layout of FIG. 1C can be verified. To describe the operation assume that the A/D converter has been running for several cycles, meaning that it is filled with charge packets. Refer to FIGS. 1C-1G, at time $t_1$ (the beginning of a cycle) the clock signal $\phi_{100}$ rises; this critically balances the comparators, including $C_1$ and biases gates $FG_1$-$FG_6$ by turning on FET transistors 147 and 247 of comparators $C_1$-$C_3$ (FIG. 1D), creating potential wells under $FG_1$-$FG_6$. At the same time, $G_3$ rises.

At time $t_2$, the clock $\phi_{100}$ falls, turning off transistors 147 and 247 and isolating the field gates so they are electrically floating. Immediately thereafter, $G_2$ falls transferring signal charge packets, as conditionally modified (at field gates 4 and 6) into wells under $FG_2$, $FG_4$, and $FG_6$, (via the $V_b$ electrodes 15-17). The fall of $G_2$ also transfers charge packets in the reference pipeline, as conditionally modified, into $FG_1$, $FG_3$ and $FG_5$ (via the $V_b$ electrodes 18-20). At the same time, since $G_2$ falls other charges residing under other $G_2$ electrodes are transferred to wells under gates designated $G_3$ (note that at this time $G_3$ is raised). Accordingly, this sequence effects splitting in $S_2$ and $S_3$. The former splitter including $G_2$ electrode 14 and $G_3$ electrodes 21 and 22. The latter splitter including $G_2$ electrode 23 and $G_3$ electrodes 24 and 25.

Since the comparators have been critically balanced, and since their inputs ($FG_1$, $FG_2$, etc.) are effective, the comparators at this point switch to states determined by their inputs.

At time $t_3$, $G_4$ rises, and shortly thereafter at time $t_4$, $G_3$ falls to move charges from the splitter outputs to the charge diverters (SW). At the same time, a new reference packet $Q_r$ is moved from the generator CG into the adjacent $G_4$ electrode 10. At time $t_5$, $G_1$ rises. Charges move out of the field gates and into deeper wells associated with $G_1$ electrodes including electrodes 26–31. Charges emerging from $FG_5$ and $FG_6$ at electrodes 28 and 31 are eliminated by drains D. Since, at the same time $\overline{G}_1$ falls, the NOR gates (see FIGS. 1D and 1E) are enabled to apply the appropriate control signals (CS1-CS4) from the comparator output to the associated charge diverter $SW_1$–$SW_4$. The NOR gates of FIGS. 1D and 1E are provided to give the gating signal $\overline{G}_1$ control over the timing of the application of control signals CS1-CS4 to the diverter electrodes. The NOR gates may be any of those known in the art, FET NOR gates, for example. At this time, the second reference packet, $Q_r$ is split at $S_1$.

$G_4$ falls ($t_6$) and $G_2$ rises ($t_7$). The charge packets at the charge diverters and at $G_1$ electrodes 11, 12, 26, 29, 27,30 are moved to the $G_2$ electrodes 13, 14 32,33,34,35 and 23. Charge not required at one output of each of the diverters $SW_3$ and $SW_4$, are eliminated at the drains D (electrodes 36, 37).

At time $t_8$, $G_1$ falls. At the same time, $\overline{G}_1$ rises disabling the NOR gates. At this time, summation of charge occur in either electrode 32 or 34 (i.e., preceding $FG_3$ or $FG_4$) and in electrode 33 or 35 (i.e., preceding $FG_5$ or $FG_6$).

It should be apparent from the foregoing that as charge is clocked through, inputs are derived for a comparator circuit in each stage, comparator outputs are used to appropriately control subsequent charge diverters so that, depending upon the comparison in one stage, the reference or signal transfer path is appropriately modified to effect a comparison in the next stage.

Figure 2C:
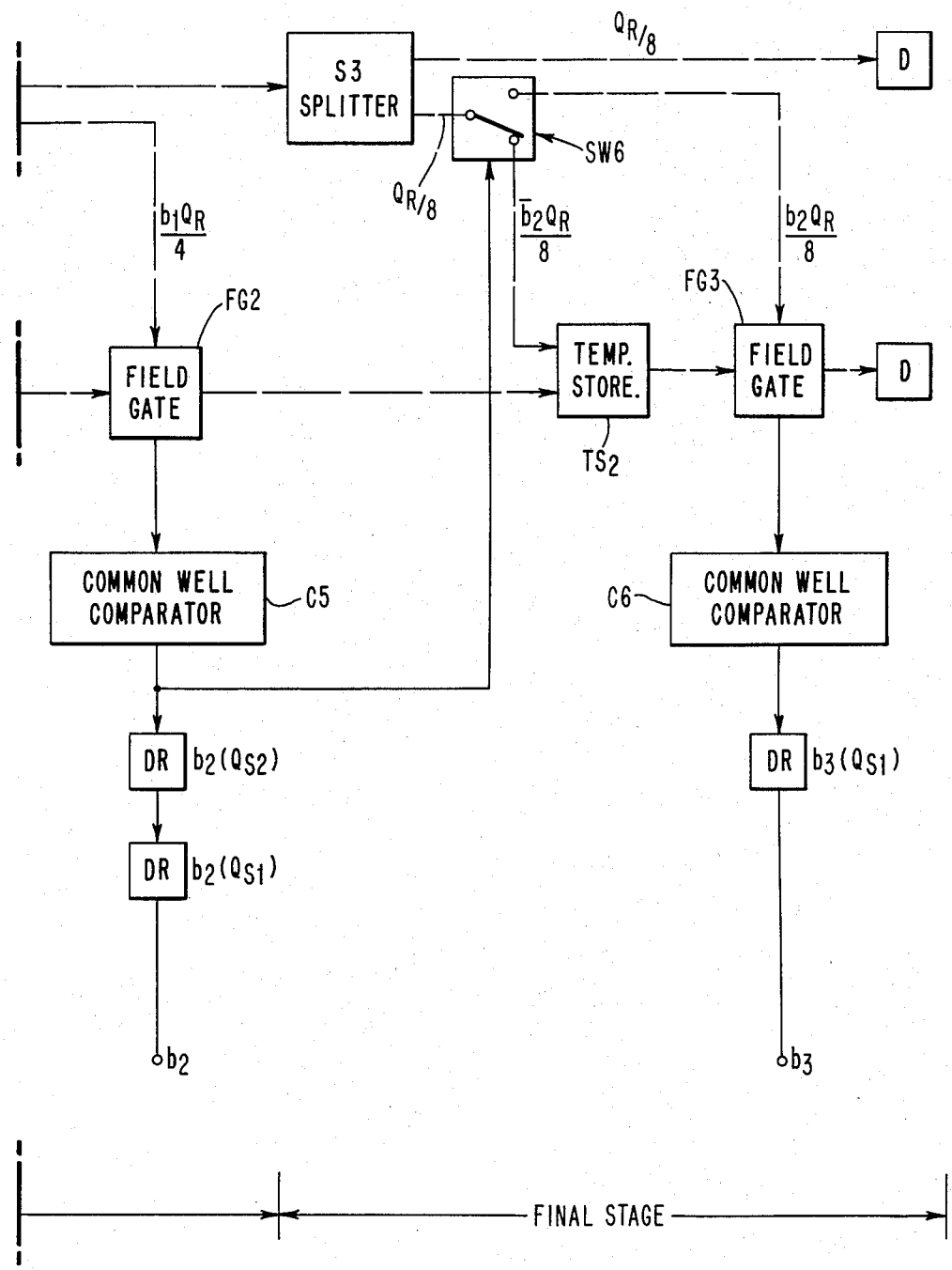

In order to explain the second embodiment reference is first made to FIGS. 2A–2C which shows a block diagram of this embodiment. A significant difference between FIGS. 1A–1B and 2A–2C is the comparators, i.e., $C_1$–$C_3$ respond to simultaneous inputs whereas $C_4$–$C_6$ respond to sequential inputs at a common input port. Accordingly, signal and reference packets in this embodiment are interleaved in alternating sequence in successive cells along a single pipeline as compared to FIGS. 1A–1B which in effect has a signal packet pipeline and a reference packet pipeline. The common well comparators ($C_4$–$C_6$) are more accurate and precise, therefore the embodiment of FIGS. 2A–2C is more suitable for high precision converters. On the other hand, the need for interleaving and more complex clocking of the comparators makes the FIGS. 2A–2C embodiment slower than that of FIGS. 1A–1B. Nevertheless, it is expected that the density of the two systems will be comparable because the common well comparators are more complex and therefore occupy more chip real estate. The order, in the pipeline of signal and reference packets is a matter of choice, the clocking described herein for the second embodiment has assumed that the reference packets precede the signal packets; this enables the elimination of one temporary storage site TS in the initial stage. The use of temporary storage sites (TS) permits both signal and reference packets to be contained simultaneously in each stage.

Referring to FIGS. 2A–2C, it will be seen that the reference packet $Q_r$ is input to the splitter $S_1$ one of whose outputs delivers comparator reference packets to a field gate $FG_1$; the other output is provided to a splitter $S_2$ in the next stage. The charge split at $S_2$ will be split again, once in each following stage to produce the modification charge packet required in each stage except the first. Since we have assumed that the reference packet precedes a signal packet, the comparator reference packet first input to $FG_1$ subjects the common well comparator $C_4$ to a first input, and is then passed along to a temporary storage site $TS_1$. Thereafter, the signal packet is input to $FG_1$ where it subjects the common well comparator $C_4$ to its second input. In general, as a signal packet enters one of the field gates, the preceding comparator reference packet is shifted to a temporary storage site and as the next succeeding comparator reference packet is input to the field gate the signal packet is shifted out to the temporary storage site. After the comparator has been subjected to its inputs, the comparator switches to a state determined by the relative magnitude of the signal and reference packets. If the signal packet is larger, the comparator output is switched to "1" and the following diverter ($SW_5$) is switched to its non-illustrated state. Thereafter, the comparator reference packet moves to $FG_2$ and the signal packet moves to a temporary storage site $TS_1$. One of the two outputs of the splitter $S_2$ ($Q_r/4$) is provided to a splitter $S_3$, but the other output is coupled to the charge diverter $SW_5$, and this charge packet may be coupled to $FG_2$ where it modifies the comparator reference packet. On the other hand, if the comparator reference packet had exceeded the signal packet, the comparator would have been in a binary zero state, and the charge diverter $SW_5$ would be in the illustrated state; accordingly the modification charge packet is then routed via the charger diverter to temporary storage site $TS_1$ where it sums with the signal charge. Thus, in accordance with the algorithm reproduced above, the location at which the modification charge is applied varies from stage-to-stage depending on the output of the previous stage's comparator. As mentioned previously, charge summing, described as occurring in the field gate, can optionally be effected in the charge transfer path leading to the field gate.

In accordance with pipelining principle, and in common with the FIGS. 1A–1B embodiment, each stage is converting a different bit of a different signal packet at all times. To generate digital quantities of more than three bits, an additional "typical" stage is added for each bit position above the three illustrated, each such typical stage has an appropriate number of deskewing register stages, if provided. At the end of the pipeline the charge packets and remaining reference packets are dumped into drains D, as was the case with the FIGS. 1A–1B embodiment. The reader can verify that with the modification of either signal or comparator reference charge packets occasioned by operation of the charge diverters, the algorithm is satisfied at each of the common well comparators.

Figure 2E:
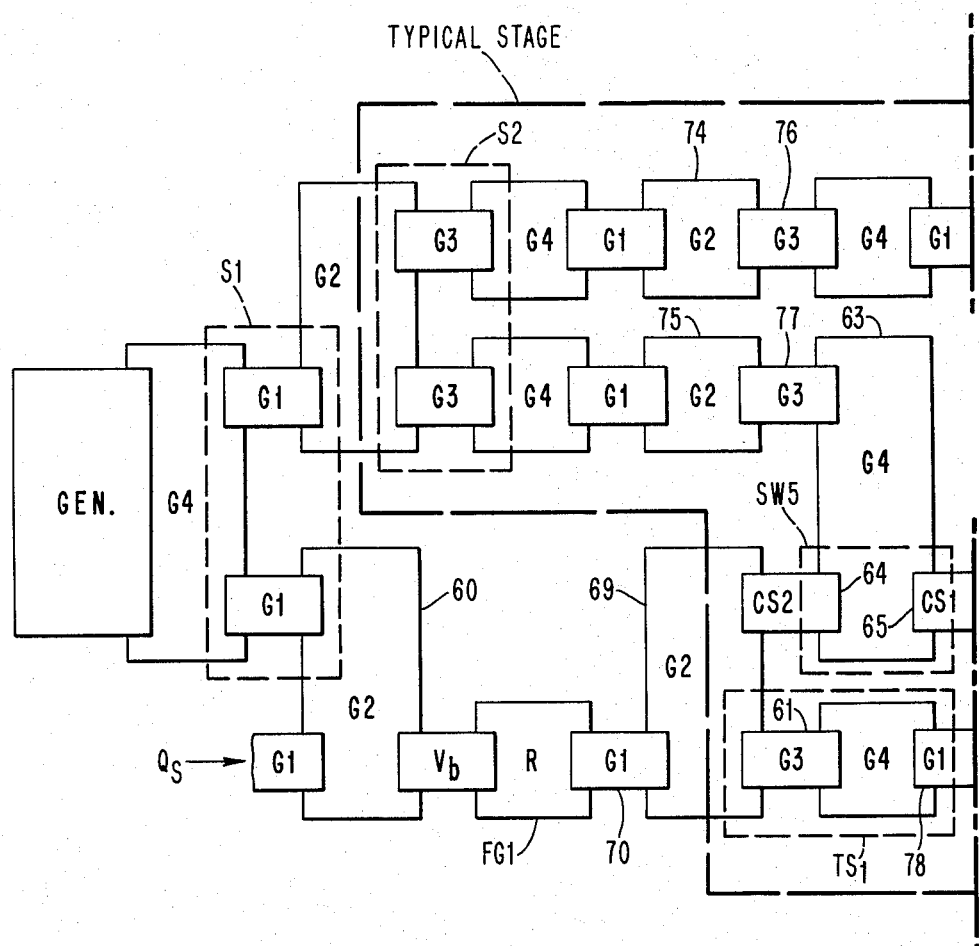
Figure 2D:
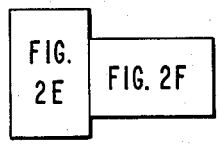
Figure 2F:
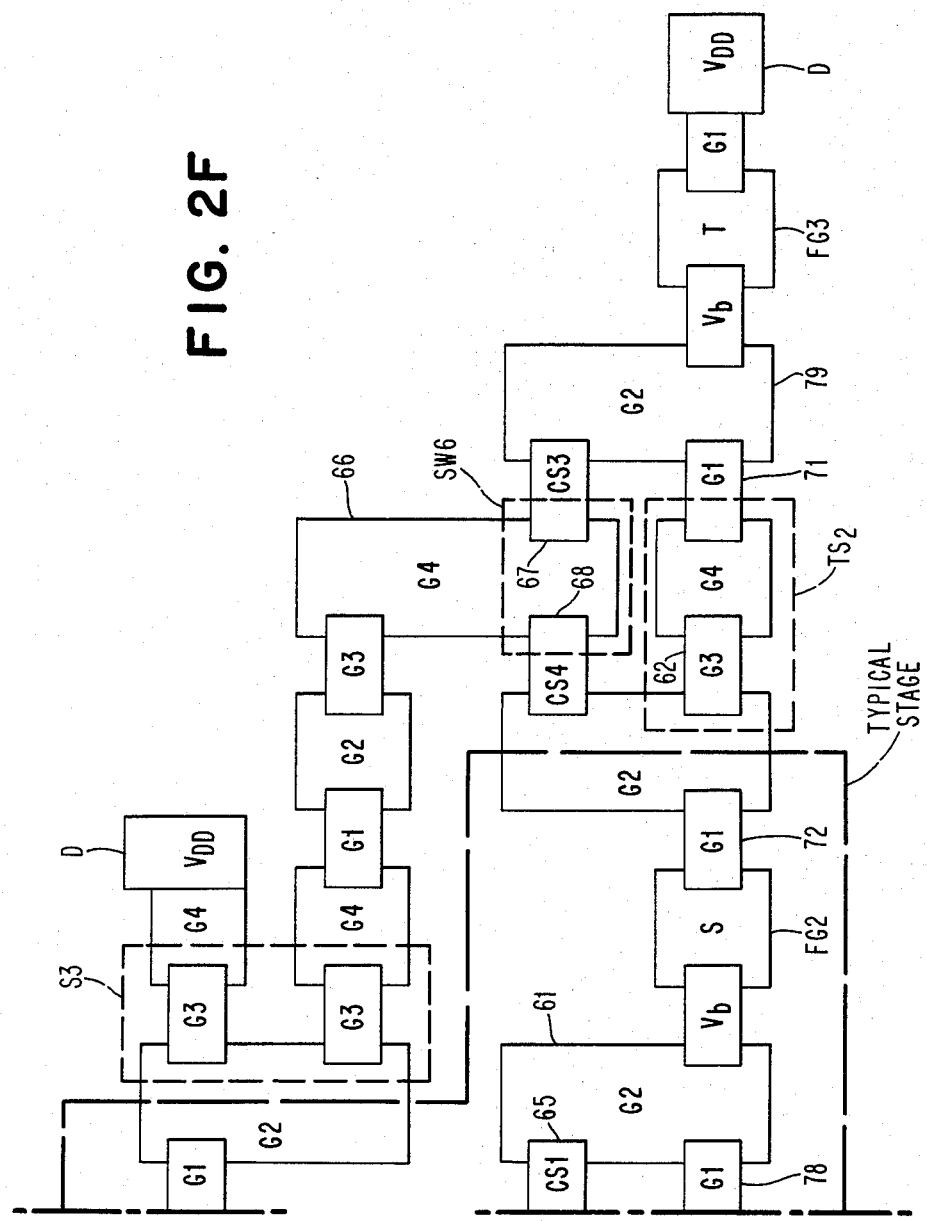

FIGS. 2E–2F illustrates the electrode layout to implement the pipelined analog/digital converter of FIGS. 2A–2C. As was the case with FIG. 1C, FIGS. 2E–2F are a plan view of the electrode layout wherein the characters within the electrode refer to the potential applied thereto, $G_1$–$G_4$ referring to gating clocks, CS1–CS4 corresponding to charger diverter control signals. $V_b$ and $V_{dd}$ refer to DC voltage levels and R–T refers to comparator input terminals. The electrodes within the dashed lines comprise the functional component of the block diagram corresponding to the associated reference characters. The heavy dashed line surrounds the components included in the typical stage.

Figure 2I:
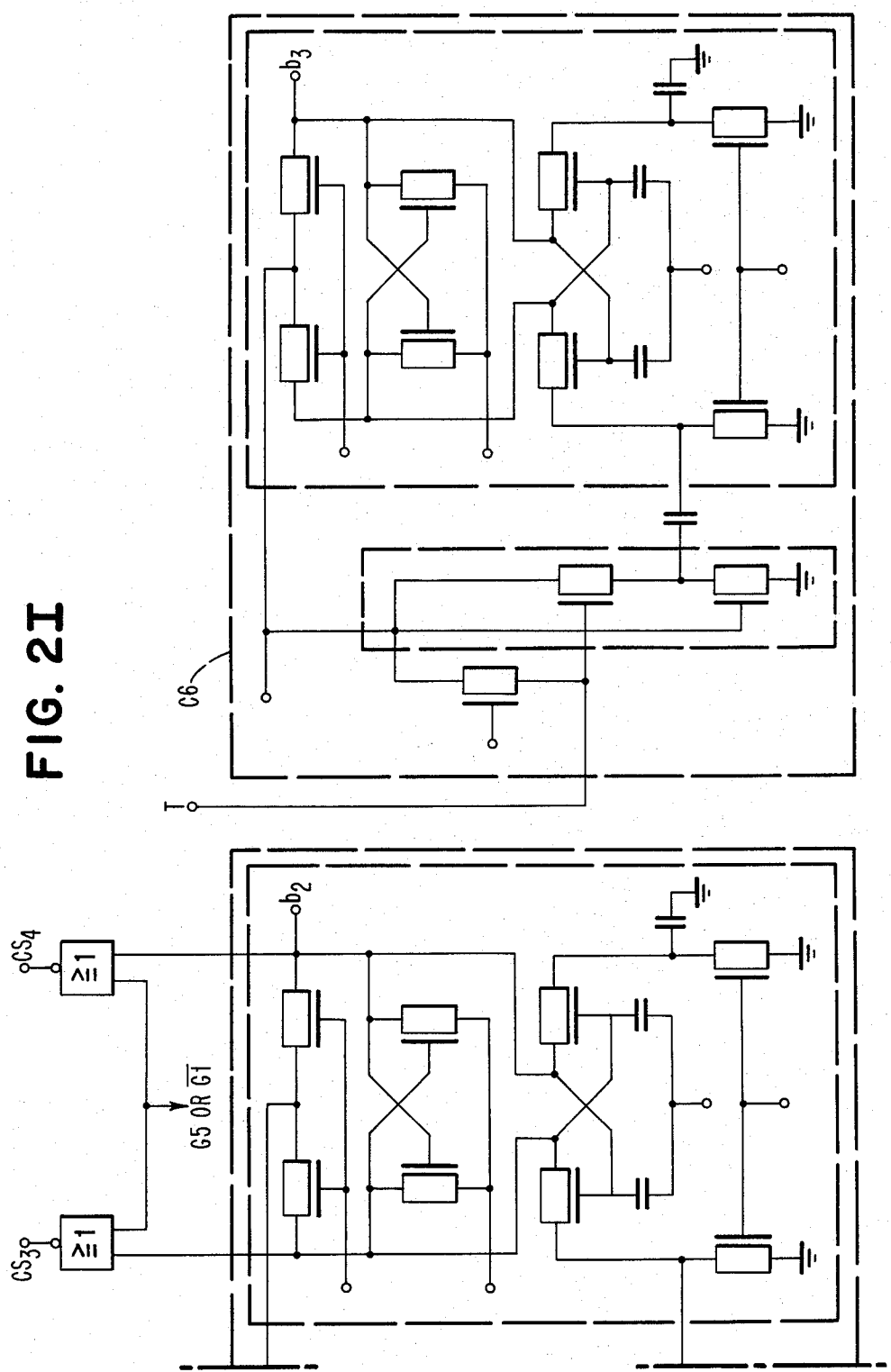

FIGS. 2H–2I are schematics of the comparators $C_4$–$C_6$ (when assembled as indicated in FIG. 2G) wherein the input terminals refer to corresponding electrodes of FIGS. 2E–2F.

To explain the manner in which FIGS. 2D–2I implement the block diagram of FIGS. 2A–2C we will assume that the device has been running for several cycles and therefore, the A/D converter is filled with charge packets. Just prior to $t_1$ the charges in the pipeline reside under $G_2$ electrodes.

At time $t_1$, $\phi_0$, $\phi_3$ and $G_3$ rise with $G_2$ in the high state. The first mentioned clock biases the field gates by turning on the transistors 47 in each comparator. This creates potential wells and also results in pulling comparator nodes F and G (see FIG. 2H) to ground by turning on transistors 49 and 51. At this time, charge packets are split in splitters $S_2$ and $S_3$. At this time the $G_2$ electrodes 79, 60 and 61 (i.e., preceding the field gates) contain previously introduced comparator reference packets while the temporary storage sites $TS_1$ et seq contain previously introduced signal packets. The signal packet corresponding to the reference packet in the initial stage has not yet entered the A/D converter.

At time $t_2$, $G_2$ falls transferring comparator reference packets into the field gates. At this time, other packets move to $G_3$ wells. In particular, signal packets move to $G_3$ electrodes 61 and 62 of temporary storage sites $TS_1$ and $TS_2$.

At time $t_3$, clock $\phi_1$ rises to critically balance the comparators (see FIG. 2J) and $G_4$ also rises. The charge packet from one of the outputs of $S_3$ is eliminated by the drain D.

At time $t_4$, clock $\phi_0$ falls to electrically float the field gates by turning off transistors 47. $G_3$ also also falls transferring packets to the $G_4$ wells, except at the charge diverter inputs which receive no charge packets at this time. No new reference packet is generated at this time.

At time $t_5$, clock $\phi_1$ falls, the comparators remain critically balanced.

At time $t_6$, $G_1$ rises allowing the comparator reference charges to flow out of the field gates into the deeper wells under the $G_1$ gates. This induces positive potentials into the field gates which appear at the nodes H of the comparators and are proportional to the comparator reference charges. The negative step in $\overline{G}_1$ is irrelevant because there is no charge at the charge diverter inputs. A new signal packet $Q_s$ enters the apparatus. Charge leaving $FG_3$ is eliminated by drain D.

Thereafter, at time $t_7$, $t_8$ and $t_9$, $G_4$ falls, $G_2$ rises and $G_1$ falls moving charges into the $G_2$ wells.

At times $t_{10}$, $t_{11}$, the clock $G_3$ rises and $G_2$ falls, to move conditionally modified signal packets into the floating gates. Negative potential steps are induced into the floating gates and thus the nodes H which are proportional to the packet charges. Accordingly, the net potential change at the nodes H have polarities corresponding to those of the difference between comparator reference and signal charge packets.

At time $t_{12}$, the clock $\phi_2$ ramps up to amplify the comparator inputs and apply them to nodes I and J. At time $t_{13}$, the clock $\phi_3$ falls enabling the latches 40–42 (see FIG. 2H) to switch to the appropriate states in dependence on the potentials at the nodes I and J.

At time $t_{14}$ the clock $\phi_1$ ramps up to provide a latch current through FET's 53 and 55 to maintain the latch state.

At time $t_{15}$ and $t_{16}$, clock $G_4$ rises, and $G_3$ falls transferring packets from $G_3$ to $G_4$ wells. Modification packets are now positioned at the inputs to the charge diverters $SW_5$ and $SW_6$. At this time a new reference charge packet enters the initial $G_4$ well.

At time $t_{17}$, clock $G_1$ rises and $G_5$ falls. Reference packets flow out of the field gates; NOR gate outputs are enabled by $G_5$ to supply appropriate control signals (CS1–CS6) to the control electrodes comprising the charge diverters. $\overline{G}_1$ ($G_1$ inverted) may be used for the $G_5$ clock because the features of the $\overline{G}_1$ waveform which are not required for $G_5$ have no effect on charge flow. $SW_5$ comprises an input $G_4$ electrode 63 and control electrodes 65 (driven by CS1) and 64 (CS2). Similarly, $SW_6$ comprises input $G_4$ electrode 66 and associated control electrodes 67 (CS3) and 68 (CS4). If comparator $C_4$ is in the zero state CS1 goes low and CS2 goes high, and vice versa. In a similar fashion CS3 and CS4 depend on the condition of comparator $C_5$. The control signals CS1–CS4 are used to steer the charge packets. Charge from $FG_3$ is eliminated by drain D. The new reference packet is split by $S_1$.

At time $t_{18}$, $G_4$ falls moving charge from the charge diverters into the appropriate charge diverter output electrodes according to the potentials applied to the control electrodes.

At time $t_{19}$ and $t_{20}$, $G_2$ rises, then $G_1$ falls and $\overline{G}_1$, rises; charges advance and the NOR gates are disabled. CS1–CS4 fall.

If $C_4$ is in one state (zero), modification charge from electrode 64 (CS2) moves to $G_2$ electrode 69 where it sums with the signal packet entering $TS_1$ via the $G_1$ electrode 70. If the comparator is in the other (one) state, then modification charge from CS1 electrode 65 sums with the comparator reference charge entering the $G_2$ electrode 61 (i.e., preceding $FG_2$). Similarly, modification charge at $SW_6$ is directed via CS3 or CS4 electrodes 67 and 68 to sum with the comparator reference packet entering via $G_1$ electrode 71 (i.e., preceding $FG_3$) or the signal packet entering via $G_1$ electrode 72 (i.e., preceding $TS_2$). The clocks $\phi_1$ and $\phi_2$ fall at $t_{18}$ in preparation for a new cycle. Latches maintain their states as a result of distributed capacitance.

In view of the foregoing it will be appreciated that in one cycle of operation (the timing for which is shown in FIG. 2J) the comparator reference portion of a reference charge packet which had entered in the preceding cycle ($t_{15}$), and had been split in $S_1$ ($t_{17}$) is applied to the floating gate ($FG_1$) at $t_2$. At the same time, the other half of the reference charge, initially split by $S_1$ ($t_{17}$) is again split at $S_2$ ($t_1$). At $t_3$ the comparator is critically balanced. At $t_4$ the packet split at $S_2$ is provided to its output. At $t_6$, when $G_1$ rises the reference packet leaves $FG_1$, and at the same time a new signal packet enters the A/D converter. As time advances, ($t_7$–$t_9$) the signal packet moves to electrode 60 (the first $G_2$ well) and the reference packet moves to electrode 69 (the $G_2$ well beyond $FG_1$). At the same time, in the upper track the two packets, each $Q_r/4$, previously output from $S_2$, continue to move synchronously with the corresponding comparator reference packet. Thus they are under $G_2$ electrodes 74, 75. At $t_{10}$, $t_{11}$, in the upper track the two $Q_r/4$ packets move along to $G_3$ electrodes 76, 77 and, in the lower track the comparator reference packet moves to the $G_3$ electrode 61 ($TS_1$). At the same time, the signal packet moves to $FG_1$. At this time the comparator has had available to it both its inputs, the next potential at node H represents the polarity of the difference between the comparator reference and signal charge packets. At $t_{12}$ the comparator input is amplified and applied to the nodes I, J. At $t_{13}$ the comparator output latch switches to the appropriate state. At $t_{16}$, when $G_3$ falls ($G_4$ having previously risen at $t_{15}$) the lower of the two $Q_r/4$ packets in the upper track is input to the charge diverter $SW_5$ (electrode 63). At the same time, a new reference packet enters the system in the initial $G_4$ well. At $t_{17}$, the clock $G_1$ rises allowing the signal packet to flow out of $FG_1$. The lower of the two upper reference charge packets flows to either the CS1 electrode 65 or the CS2 electrode 64 depending on the comparator output, and at the same time the leading comparator reference packet flows to the $G_1$ electrode 78. Thereafter, when $G_2$ rises and $G_1$ falls and the comparator NOR gates are disabled ($t_{19}$ and $t_{20}$) the lower of the two upper reference charge packets either adds with the leading comparator reference packet (at the electrode 61) or the following signal packet (at electrode 69). Accordingly, as is shown in FIGS. 2A–2C the lower of the two upper reference charge packets flows through the charge diverter $SW_5$ to either the temporary storage site (where it is added to the signal packet) or the $G_2$ electrode 61 preceding $FG_2$ (where it is added to the leading reference packet).

In the foregoing fashion as each signal packet/comparator reference packet pair advances through the system, each comparator makes a different bit determination. That determination is made available to the output deskewing register and also controls the associated charge diverter in the manner just explained.

As is also described in the copending application, it is desirable to minimize average quantization errors by reducing each threshold by $Q_r/2^{N+1}$. Two techniques can be applied. The quantity $Q_r/2^{N+1}$ can be added to $Q_s$ when $Q_s$ enters the A/D converter, although this reduces the dynamic range of the converter by an equal quantity. Alternatively, half the least significant bit can be added to the digital output by tacking on a binary 1 at the end of each digital word. This leaves the dynamic range intact but increases the number of bits to be handled by an additional bit.

In addition fat zeros are preferably handled by external apparatus, for example, a digital processor can sense the digital value of the fat zero charge and subtract it from each digitized $Q_s$ word W.

The foregoing description has been given in terms of n-channel silicon CCD technology with two layer polysilicon gate electrodes. The use of p-channel CCD's, of semiconductors other than silicon, and of other electrode structures and materials are known. The application of these and other design alternatives to the present invention should be apparent in view of the preceding description. Similarly, the implementation with four overlapping clock pulses per cycle $G_1$–$G_4$ and four electrodes per charge packet in the pipeline represents a design selection which is not essential to this invention.

Having thus described my invention, what I claim as new, and desire to secure by Letters Patent is:

1. A charge coupled A/D system including a plurality of pipelined charge processing stages for performing successive approximations on a reference analog charge $Q_r$ and an input signal charge $Q_s$ wherein:

each of said pipelined charge processing stages are coupled only to directly adjacent stages for propagation of reference and input signal charges, each said pipelined charge processing stage includes charge processing means, including comparator means, for performing an inequality function, said plurality of pipelined charge processing stages providing a bit string $b_1$ through $b_N$ representing a digital representation of said input analog signal charge $Q_s$;

which includes a different stage for each bit, $b_1$ through $b_N$, of said digital representation an in which each stage, other than an initial and final stage comprise:

charge splitter means subjected to an input charge packet Qi for delivering, on separate charge transfer paths, a pair of charge packets Qi/2;

a pair of commonly controlled charge switching means, each with a charge input and a pair of outputs, each said charge switching means connected to receive a one of said charge packets Qi/2;

a single electrode and means coupling an output of each of said charge switching means to said electrode;

and a pair of field gate means for generating input voltages for said comparator means each coupled to other outputs of said charge switching means;

and means for controlling said charge switching means whereby a charge packet Qi/2 is input to one or another of said field gate means regardless of a condition of said charge switching means.

2. The apparatus of claim 1 in which said means for controlling said charge switching means includes an output from a comparator means of a directly preceding stage.

3. The system of claim 1 which further includes a deskewing register with at least one stage in each of said pipelined stages.

* * * * *

UNITED STATES PATENT AND TRADEMARK OFFICE
CERTIFICATE OF CORRECTION

PATENT NO. : 4,489,309

DATED : December 18, 1984

INVENTOR(S) : Eugene S. Schlig

It is certified that error appears in the above-identified patent and that said Letters Patent is hereby corrected as shown below:

Col. 2, line 19, change "work" to -word-.

Col. 4, line 33, change "the" (first occurrence) to -in-.

Col. 11, line 43, delete "also" (second occurrence).

Col. 14, line 29, change "an" to -and-;

line 38, delete "a".

Signed and Sealed this

Eleventh Day of June 1985

[SEAL]

Attest:

DONALD J. QUIGG

Attesting Officer

Acting Commissioner of Patents and Trademarks